(12) United States Patent
Kim (10) Patent No.: US 7,333,336 B2
(45) Date of Patent: Feb. 19, 2008

(54) HEAT RADIATING APPARATUS

(75) Inventor: Kyoung-Ho Kim, Suwon (KR)

(73) Assignee: LG Electronics Inc., Seoul (KR)

( * ) Notice: Subject to any disclaimer, the term of this patent is extended or adjusted under 35 U.S.C. 154(b) by 302 days.

(21) Appl. No.: 11/044,731

(22) Filed: Jan. 28, 2005

(65) Prior Publication Data

US 2006/0082972 A1   Apr. 20, 2006

(30) Foreign Application Priority Data

Oct. 20, 2004   (KR)   ................ 10-2004-0084068

(51) Int. Cl.
*H05K 7/20* (2006.01)
*H01B 7/42* (2006.01)
*F28D 15/00* (2006.01)

(52) U.S. Cl. ............... 361/709; 174/15.2; 165/104.33; 361/700; 361/701; 361/702

(58) Field of Classification Search ........ 361/700–703, 361/709; 257/675; 174/15.1–15.2, 16.3; 165/80.2–80.4, 104.33; 439/487
See application file for complete search history.

(56) References Cited

U.S. PATENT DOCUMENTS

| | | | |
|---|---|---|---|
| 5,959,837 A | 9/1999 | Yu ............................. 361/697 |
| 6,625,021 B1 * | 9/2003 | Lofland et al. ............. 361/697 |
| 6,880,346 B1 * | 4/2005 | Tseng et al. .................. 62/3.7 |
| 6,915,844 B2 * | 7/2005 | Chou ..................... 165/104.33 |
| 6,938,682 B2 * | 9/2005 | Chen et al. ............. 165/104.33 |
| 6,945,318 B2 * | 9/2005 | Ma et al. ................ 165/104.33 |
| 6,967,845 B2 * | 11/2005 | Chiang et al. .............. 361/709 |
| 6,978,829 B1 * | 12/2005 | Lin ....................... 165/104.33 |
| 7,011,144 B2 * | 3/2006 | Zeighami et al. ...... 165/104.21 |
| 7,128,135 B2 * | 10/2006 | Mok et al. ............. 165/104.26 |
| 2003/0011990 A1 | 1/2003 | Lai et al. .................... 361/697 |
| 2003/0137047 A1 * | 7/2003 | Lopatinsky et al. ......... 257/722 |
| 2004/0047126 A1 | 3/2004 | Shih-Tsung ................. 361/688 |
| 2004/0108104 A1 * | 6/2004 | Luo ........................... 165/181 |
| 2004/0129409 A1 | 7/2004 | Mok ......................... 165/80.3 |

(Continued)

FOREIGN PATENT DOCUMENTS

DE    20 2004 001 729 U1    5/2004

(Continued)

OTHER PUBLICATIONS

European Search Report dated Aug. 14, 2006.

*Primary Examiner*—Jayprakash Gandhi
*Assistant Examiner*—Bradley H Thomas
(74) *Attorney, Agent, or Firm*—Ked & Associates, LLP (57) ABSTRACT

A heat radiating apparatus is provided which includes a heat sink configured to be positioned in thermal contact with a heat source in order to take heat from the heat source, at least one heat pipe having a portion connected to the heat sink and configured to transfer the heat from the heat sink, a heat exchanger in thermal communication with the at least one heat pipe, formed with a through chamber at a center thereof, and positioned adjacent to the heat sink, and a fan unit installed at least partially in the through chamber of the heat exchanger and configured to generate an airflow through the heat exchanger. Heat generated not only by a specified heat source but also by an interior of electronic equipment can be quickly radiated.

28 Claims, 5 Drawing Sheets

U.S. PATENT DOCUMENTS

| | | | |
|---|---|---|---|
| 2004/0196632 A1* | 10/2004 | Chen et al. | 361/697 |
| 2005/0087329 A1* | 4/2005 | Zhang et al. | 165/104.33 |
| 2005/0141202 A1* | 6/2005 | Lee et al. | 361/704 |
| 2005/0231916 A1* | 10/2005 | Bahl et al. | 361/700 |
| 2006/0039110 A1* | 2/2006 | Foster et al. | 361/697 |

FOREIGN PATENT DOCUMENTS

| | | |
|---|---|---|
| EP | 1 075 072 A1 | 2/2001 |
| KR | 10 2002 0021845 | 3/2002 |
| KR | 10 2003 0010829 | 2/2003 |

* cited by examiner

FIG. 1

Related Art

HEAT RADIATING APPARATUS

BACKGROUND OF THE INVENTION

1. Field of the Invention

The invention relates to a heat radiating apparatus.

2. Background of the Related Art

As the performance of electronic equipment improves, heat generated from inner parts tends to increase considerably. If the heat is not smoothly radiated, the adjacent parts, as well as the corresponding heating parts, are influenced by the heat, so that the electronic equipment does not exhibit the desired performance or is out of order due to damage to the parts.

Figure 1:
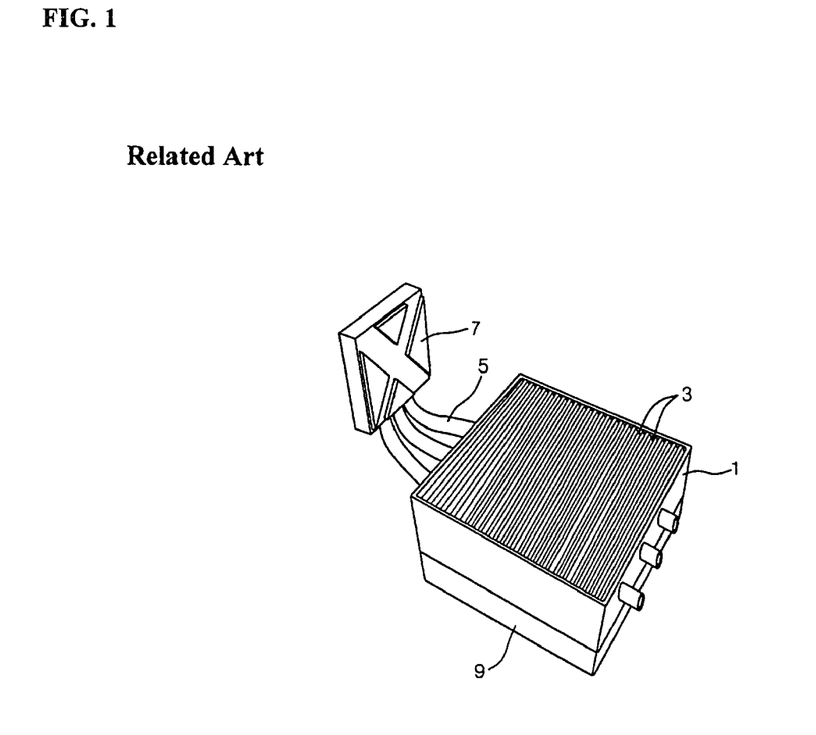
FIG. 1 is a perspective view of a related art heat radiating apparatus.

In order to solve this problem, recently, a heat radiating apparatus using heat pipes capable of transferring heat a predetermined distance has been developed. Such a related art heat radiating apparatus is shown in FIG. 1. Referring to FIG. 1, a casing 1 is shaped in a hexahedron, both opposite faces of which are opened. Radiating fins 3 in the shape of a plate with a predetermined thickness and width are provided at regular intervals extending from one side surface to the other opposite side surface in the casing 1. Gaps between the radiating fins 3 form channels for allowing air to flow from one of the open faces to the other open face of the casing 1.

From the one side surface to the other opposite side surface of the casing 1, heat pipes 5 are installed to penetrate the casing 1 and the radiating fins 3. The heat pipes 5 serve to forcibly transfer heat, which is generated by the heat source, to the radiating fins 3.

One end of each of the heat pipes 5 is connected to a heat source contact portion 7. The heat source contact portion 7, which is made of a material with a superior heat transfer rate, is installed so as to contact with a side of the heat source.

One of the open faces of the casing 1 is provided with a fan unit 9 for generating airflow that passes between the radiating fins 3. The airflow takes the heat from the radiating fins 3, and radiates the heat outside the heat radiating apparatus.

However, the heat radiating apparatus according to the above related art has at least the following problems.

In a heat radiating apparatus so constructed, by bringing the heat source contact portion 7 into contact with a central processing unit (CPU), the heat generated from the CPU is transferred to the radiating fins 3, which are at a distance from the heat source contact portion 7, through the heat pipes 5, and is then discharged outside the heat radiating apparatus. However, since recently developed CPUs generate a relatively large amount of heat, there is the problem that the heat cannot be effectively radiated.

In addition, since heat generated from not only the CPU but also other heat sources around the CPU tends to increase, there is the problem that heat management in the whole electronic equipment cannot be effectively performed by such a related art heat radiating apparatus, which is designed to cool only the CPU.

Further, electronic equipment, such as computers, are getting slimmer with time. Thus, since a large space is required for installation of such a related art heat radiating apparatus, the related art heat radiating apparatus is a factor that hinders the electronic equipment from being made thinner.

SUMMARY OF THE INVENTION

An object of the invention is to solve at least the above problems and/or disadvantages and to provide at least the advantages described hereinafter.

To achieve at least these objects, in whole or in part, and in accordance with the purposes of the invention, as embodied and broadly described herein, there is provided a heat radiating apparatus in accordance with an embodiment of the invention that includes a heat sink configured to be positioned in thermal contact with a heat source in order to take heat from the heat source, at least one heat pipe having a portion connected to the heat sink and configured to transfer the heat from the heat sink, a heat exchanger in thermal communication with the at least one heat pipe, formed with a through chamber at a center thereof, and positioned adjacent to the heat sink, and a fan unit installed at least partially in the through chamber of the heat exchanger and configured to generate an airflow through the heat exchanger.

To further achieve at least these objects, in whole or in part, and in accordance with the purposes of the invention, as embodied and broadly described herein, there is provided a heat radiating apparatus in accordance with an embodiment of the invention that includes a heat sink configured to be positioned in thermal contact with a heat source in order to take heat from the heat source, at least one heat pipe having a portion connected to the heat sink and configured to transfer the heat from the heat sink, a heat exchanger in the form of a circular cylinder in thermal communication with the at least one heat pipe and positioned adjacent to the heat sink, and a fan unit installed at least partially in the substantially circular cylinder and configured to generate an airflow through the heat exchanger.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements and wherein.

DETAILED DESCRIPTION OF PREFERRED EMBODIMENTS

A heat radiating apparatus in accordance with embodiments of the invention will now be described in detail with reference to the drawings, in which like reference numerals have been used to designate like elements.

Figure 2:
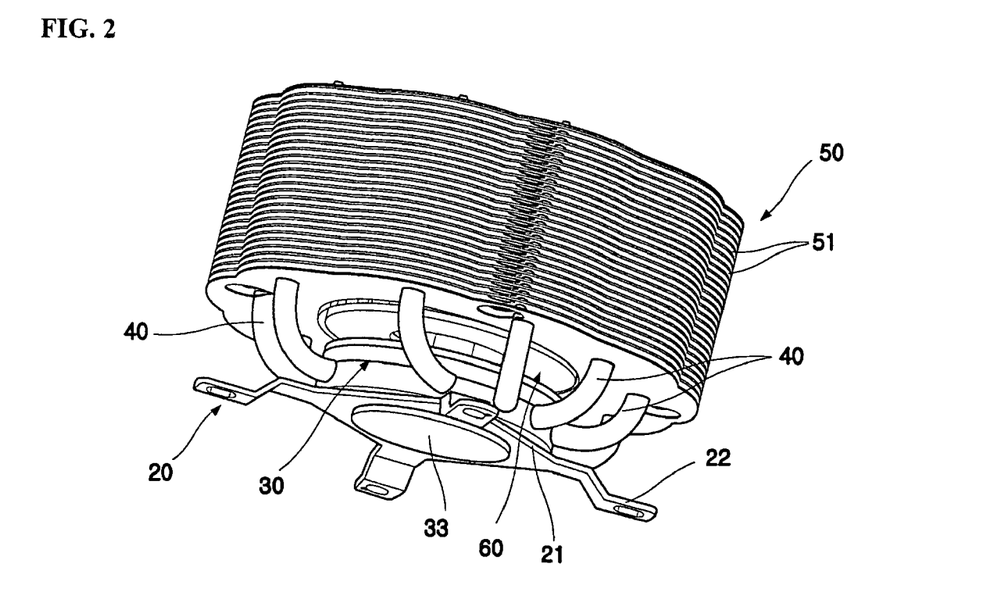
FIG. 2 is a schematic perspective view of a heat radiating apparatus according to an embodiment of the invention.
Figure 3:
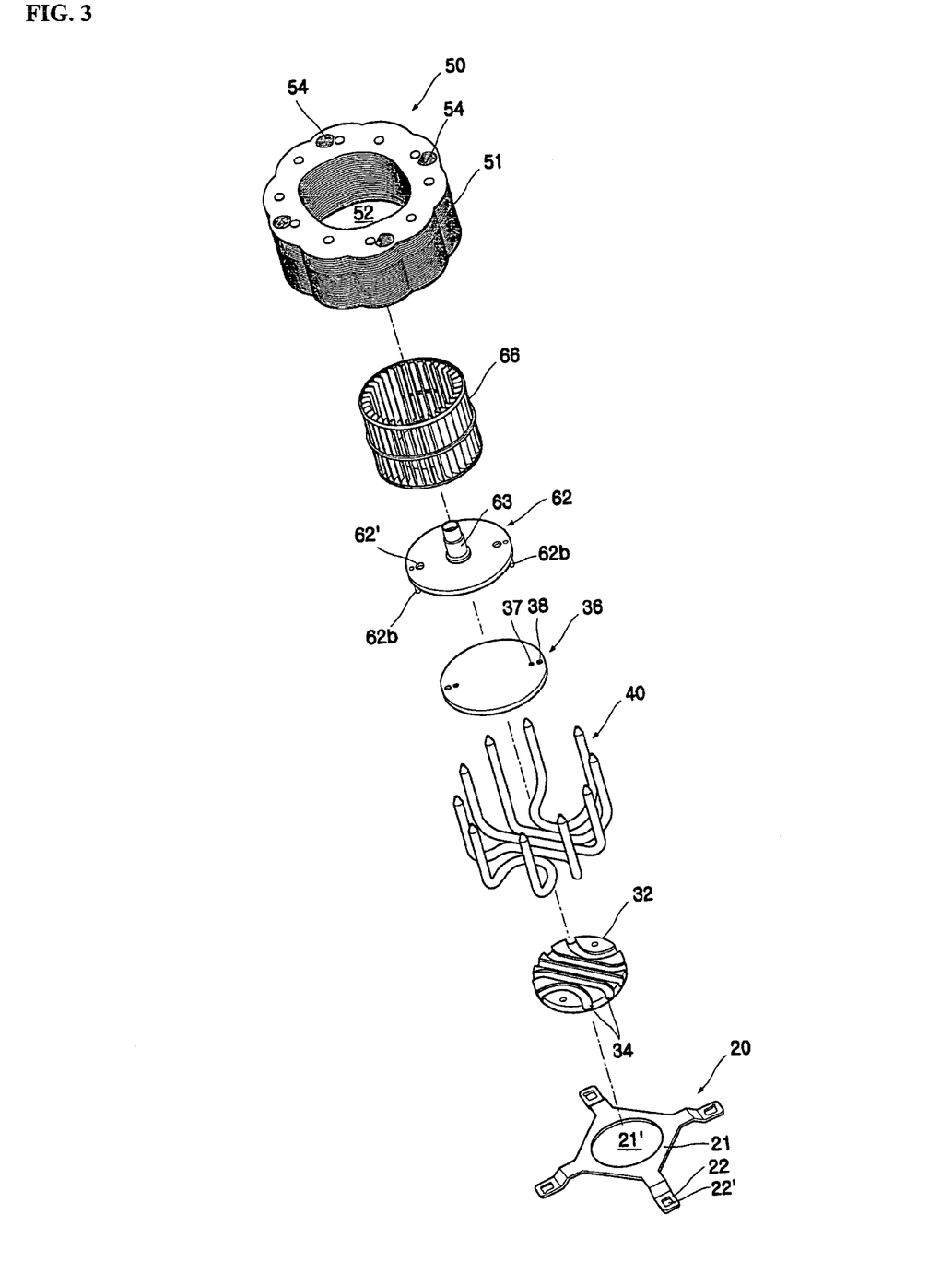
FIG. 3 is a schematic exploded perspective view of a portion of the heat radiating apparatus of FIG. 2.
Figure 4:
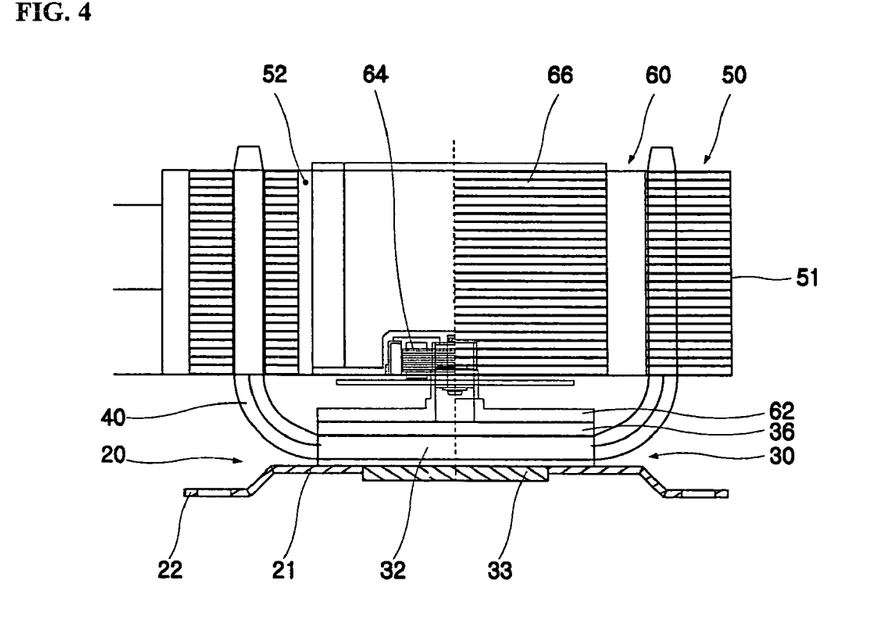
FIG. 4 is a schematic sectional view of the heat radiating apparatus of FIG. 2.

FIG. 2 is a schematic perspective view of a heat radiating apparatus according to an embodiment of the invention. FIG. 3 is a schematic exploded perspective view of the heat radiating apparatus of FIG. 3. FIG. 4 is a schematic sectional view of the heat radiating apparatus of FIG. 2.

As shown in FIGS. 2-4, a fixing clip 20 may comprise an upper plate 21, substantially rectangular in shape in this embodiment, and fixing legs 22, provided at each of four corners of the upper plate 21 in this embodiment. A through portion 21' may be formed at a center of the upper plate 21. The fixing legs 22 are portions each of which is directly fastened to, for example, a substrate on which a heat source, such as a CPU, is installed. The fixing legs 22 cause the upper plate 21 to be positioned at a predetermined distance from the substrate. A distal end of each fixing leg 22 may be formed with a fastening hole 22'.

A heat sink 30 may be mounted on an upper surface of the upper plate 21 of the fixing clip 20. The heat sink 30, which may be in the shape of a circular disk as shown in the embodiment of FIG. 3, may be manufactured of a metal with a superior heat transfer rate, such as copper or aluminum. Of course, the heat sink 30 is not necessarily in the shape of a circular disk. That is, the heat sink may be formed in a flat, polyhedral shape, such as a hexahedron, or other appropriate shape. The heat sink 30 may be positioned in direct contact with a heat source, such as a CPU.

The heat sink 30 may include a base block 32. In this embodiment, the base block 32 is in the shape of a circular disk. A bottom surface of the base block 32 may be provided with a heat source contact portion 33, which is exposed below the upper plate 21 through the through portion 21'. Since the heat source contact portion 33 may be thicker than the upper plate 21, the heat source contact portion 33 may protrude below the upper plate 21, so as to come into contact with an upper surface of the heat source when the fixing clip 20 is mounted on the substrate. Although the heat source contact portion 33 is in the shape of a circular disk in this embodiment, other shapes may also be appropriate, in particular if the heat source contact portion 33 comes into contact with the whole of the upper surface of the heat source.

One surface of the base block 32, that is, the surface opposite to that formed with the heat source contact portion 33, may be formed with a plurality of seating grooves 34, as shown in FIG. 3. Heat pipes 40, which will be described below, may be seated in the seating grooves 34. The seating grooves 34 may be uniformly formed on the whole surface of the base block 32, as shown in FIG. 3.

A cover plate 36 may be provided to cover the seating grooves 34 of the base block 32 as shown in FIG. 3. The cover plate 36 may be attached to the base block 32 by, for example, welding. A surface of the cover plate 36, which is engaged with the base block 32, may also be formed with seating grooves (not shown) corresponding to the seating grooves 34 of the base block 32. As described above, by allowing the seating grooves 34 of the base block 32 and the seating grooves of the cover plate 36 to be engaged to each other, outer surfaces of the heat pipes 40 can come into full contact with inner surfaces of the seating grooves 34.

The cover plate 36 may be provided with fastening holes 37 for fastening the cover plate 36 to a motor base 62, which will be described below. As shown in FIG. 3, the fastening holes 37 may be formed symmetrically with respect to a center of the cover plate 36. Guide holes 38 may also be formed adjacent to the fastening holes 37 in order to guide an engaging position of the motor base 62 and the cover plate 36. However, the fastening holes 37 are not necessarily positioned adjacent to the guide holes 38.

The heat sink 30 may be provided with a plurality of heat pipes 40. Both ends of each heat pipe 40, which do not come into thermal contact with the heat sink 30, may extend from a rim of the heat sink 30 vertically to the surface of the heat sink 30. In this embodiment, each of the heat pipes 40 is formed in the shape of a 'U'.

Figure 5:
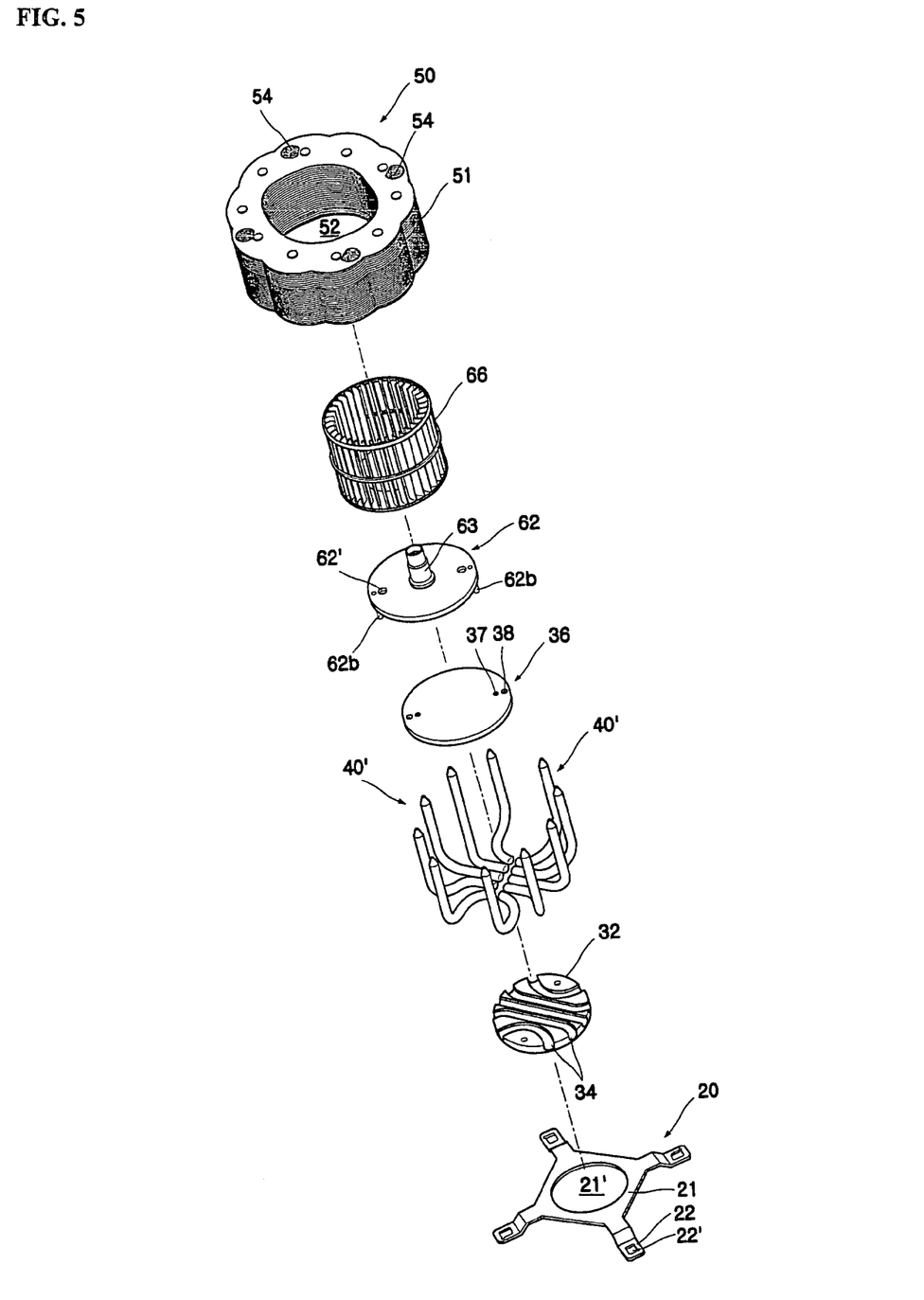
FIG. 5 is a schematic exploded perspective view of a heat radiating apparatus according to another embodiment of the invention.

However, the heat pipes 40 are not necessarily so shaped, and one end of the heat pipe 40' may be in thermal contact with the heat sink 30 and the other end may extend vertically to the surface of the heat sink 30, as shown, for example, in FIG. 5. In such a case, the number of the heat pipes 40' may be double that of the embodiment shown in FIG. 3. In any case, the ends of the heat pipes, 40' extend from the rim of the heat sink 30 vertically to the surface of the heat sink 30. The heat pipes, 40' serve to transfer the heat from one end to the other end thereof by allowing the working fluid provided in the heat pipes, 40' to flow while changing phase due to the heat.

Heat exchanger 50 may be installed on the heat sink 30, so that a gap between the upper plate 21 and the heat exchanger 50 is relatively small. That is, the gap is as small as the heat sink 30 and the motor base 62, minimizing an overall height of the heat radiating apparatus.

The heat exchanger 50 is a portion to which the heat generated from the heat source is transferred through the heat sink 30 and the heat pipes 40, and from which the heat is transferred to the ambient air. The heat exchanger 50 may be formed in a substantially circular cylindrical shape. Further, the heat exchanger 50 may be formed by laminating at predetermined intervals a plurality of radiating fins 51, each of which is in the shape of a circular disk with a vent hole at a center thereof. Although in this embodiment, a contour of each radiating fin 51 comprises a plurality of circular arcs connected to each other, the radiating fin 51 may be in the shape of a circle with the same curvature, or an other appropriate shape. A space formed in the heat exchanger 50 is referred to as a through chamber 52.

A plurality of the tool through holes 54 may be provided to extend through the heat exchanger 50. The tool through holes 54 may be formed in the direction in which the heat pipes 40 penetrate the heat exchanger 50. The tool through holes 54 are formed at positions corresponding to the fastening holes 22' of the fixing clip 20. A tool, such as a driver for fastening and loosening screws, for fixing the fixing clip 20 to the substrate is allowed to pass through the tool through holes 54. By forming the tool through holes 54 in the heat exchanger 50 as above, it is possible to appropriately design the heat exchanger 50 corresponding to dimensions of the fixing clip 20.

The heat pipes 40 may vertically penetrate the radiating fins 51 at regular intervals. The radiating fins 51 may be supported by the heat pipes 40 and may be installed to be spaced apart from each other a predetermined interval caused by burs formed when vent holes for the penetration of the heat pipes 40 are formed. However, the radiating fins 51 may be laminated with predetermined gaps therebetween by other means.

In the embodiment of FIGS. 2-4, air flows into the heat exchanger 50 through an upper side of the through chamber 52 and then radially flows out while being delivered to an outer peripheral face through the gaps between the radiating fins 51. A fan unit 60 may be provided on the heat sink 30 so as to be positioned in the through chamber 52 of the heat exchanger 50. The fan unit 60 serves to generate the airflow passing through the heat exchanger 50.

The fan unit 60 includes a motor base 62, a motor 64, and a fan 66. The motor base 62 serves to support the fan unit 60. The motor base 62 may be formed of a material with a lower heat transfer rate, such as polypropylene. The motor base 62 may be fastened onto the cover plate 36. Fastening holes 62' may be provided extending through the motor base 62 at positions corresponding to the fastening holes 37 of the cover plate 36. The motor base 62 is formed with guide bosses 62b which protrude at positions corresponding to the guide holes 38 of the cover plate 36. Reference numeral 63 designates a bearing support portion.

The motor 64, which may be installed on the motor base 62, provides a driving force for driving the fan 66. In the embodiment of FIGS. 2-4, the fan 66 is positioned in the through chamber 52. A Sirocco Fan is used in the embodiment of FIGS. 2-4, although other fans may also be utilized. The fan 66 radially discharges air introduced in the direction of its rotational axis.

Hereinafter, an operation of a heat radiating apparatus according to embodiments of the invention so constructed will be described in detail.

First, an assembling process of a heat radiating apparatus according to embodiments of the invention will be described briefly. The base block 32 of the heat sink 30 is fixed onto the fixing clip 20, and the heat pipes 40 are seated on the base block 32. While the heat pipes 40 are seated in the seating grooves 34, the cover plate 36 is engaged to the base block 32 by, for example, welding. After engaging the heat pipes 40 to the heat sink 30, they may be fixed to the fixing clip 20.

In such a case, ends of the heat pipes 40 extend vertically at predetermined intervals to the surface of the heat sink 30 around the rim of the heat sink 30, in the opposite direction of the fixing clip 20. Next, the heat exchanger 50 is formed by installing a plurality of the radiating fins 51 at predetermined intervals to be supported on the heat pipes 40. When being assembled, the heat exchanger 50 may be engaged to the heat pipes 40.

When the heat exchanger 50 is completely installed, the fan unit 60 is installed in the heat exchanger 50. That is, the fan 66 is positioned in the through chamber 52 by seating the motor base 62 on the heat sink 30.

Now, a radiating process in a heat radiating apparatus according to embodiments of the invention will be described. When electronic equipment operates, a variety of parts therein generate heat. Using a computer as an example, a large amount of heat is generated from a power management chip, a main chipset, and graphic chipset, installed adjacent to a CPU, an upper surface of which the heat sink 30 is in close contact with.

The heat generated from the CPU is transferred to the heat sink 30 through the heat source contact portion 33, and is then transferred from the heat sink 30 to the heat pipes 40. The heat transferred to the heat pipes 40 is transferred to the ends of the heat pipes 40 and penetrates the heat exchanger 50 by means of the working fluid in the heat pipes 40. The heat transferred to the ends of the heat pipes 40 is transferred to the radiating fins 51 of the heat exchanger 50.

Figure 6:
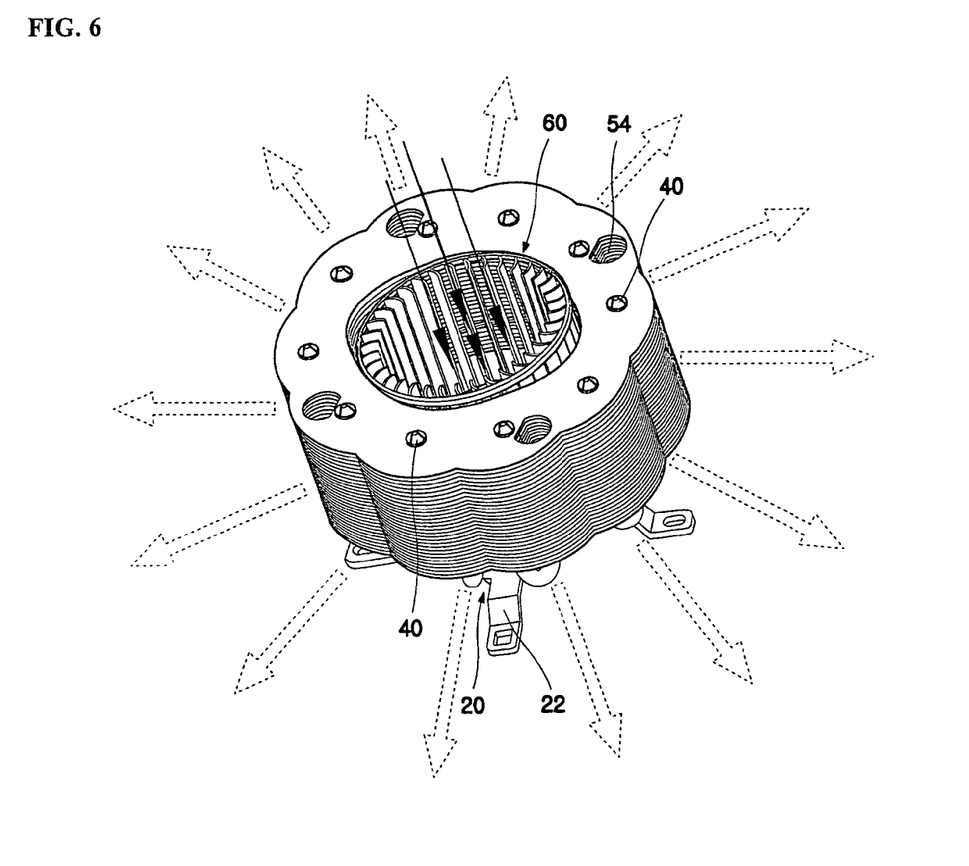
FIG. 6 is a schematic perspective view showing operation of embodiments of the invention.

In the meantime, airflow is generated by the fan unit 60. That is, when the fan unit 60 is driven, the air is introduced into the fan 66 in the direction of the solid line arrows shown in FIG. 6, passes through the fan 66, and is delivered to the heat exchanger 50. From the fan 66, the air passes through the gaps between the radiating fins 51 of the heat exchanger 50 and is radially discharged.

The air takes the heat from the radiating fins 51 while passing through the gaps between the radiating fins 51. The air discharged to outside the heat exchanger 50 flows to other surrounding heat sources, so that the heat in the electronic equipment can be discharged outside thereof. Since the air is discharged and flows out of the heat exchanger 50 in all radial directions, as shown in dotted line by the arrows of FIG. 6, the heat in the electronic equipment is discharged to the outside while the air flows in the overall interior of the electronic equipment.

Then, in the case where the heat exchanger 50 is generally in the shape of a circular cylinder, by shaping each of the radiating fins 51 in a circular disk with the vent hole at a center thereof, a surface area of the radiating fins 51 is relatively large. Thus, a radiation area of heat exchanger 50 is relatively large compared with other heat exchangers with the same volume. Thus, it is possible to improve heat radiation performance.

In addition, since the tool through holes 54 are formed in the heat exchanger 50, it is possible to optimize dimensions of the heat exchanger 50 to correspond to the fixing clip 20. In such a case, it is possible to maximize the heat radiation performance of the heat exchanger 50 versus a space occupied by the heat exchanger 50.

For reference, Table 1 shows test results of the heat radiating apparatus according to an embodiment of the invention and a related art heat radiating apparatus under the same conditions. Here, the heat source is a 103 W CPU.

TABLE 1

|  | Embodiment of the Invention | Related Art |
| --- | --- | --- |
| CPU | 54.0° C. | 62.9° C. |
| Graphic Chipset (Memory Control Hub) | 62.1° C. | 73.3° C. |
| I/O Control Hub | 55.6° C. | 62.5° C. |
| RAM | 54.0° C. | 62.6° C. |
| Hard disk drive | 51.3° C. | 58.1° C. |
| Side Vent of Main Body | 35.0° C. (ambient) | 35.0° C. (ambient) |

A heat radiating apparatus according to embodiments of the invention provides at least the following advantages.

Embodiments of the invention provide a heat radiating apparatus capable of radiating a relatively large amount of heat. That is, since the heat exchanger is constructed, for example, by laminating radiating fins, each of which may be in the shape of a circular disk with a vent hole at a center thereof, the radiation area of the heat exchanger is relatively large. Thus, it can be expected to effectively radiate the heat generated from the heat source. Further, since the heat radiating apparatus according to embodiments of the invention is constructed by laminating in order the heat source, the heat sink, and the heat exchanger, and the fan unit is installed in the heat exchanger, it is possible to minimize a space for installing the heat radiating apparatus. Thus, there is the advantage that the electronic equipment in which the heat radiating apparatus is used can also be compact.

Further, embodiments of the invention provide a heat radiating apparatus capable of radiating heat generated from not only a specified heat source but also other heat sources around the specified heat source in electronic equipment by forced air circulation. That is, with a heat radiating apparatus in accordance with embodiments of the invention, the heat generated from not only a specified heat source but also an interior of electronic equipment can be quickly radiated. Since the heat exchanger according to embodiments of the invention is constructed so that the air passing through the heat exchanger is discharged in all radial directions thereof, in addition to the heat of the heat source in direct contact with the heat sink, the heat of a variety of other heat sources in the electronic equipment can be discharged by generating the airflow in the electronic equipment.

Additionally, embodiments of the invention provide a heat radiating apparatus which is light, slim, simple, and compact. That is, since a size of the heat radiating apparatus may be minimized, there is an advantage in that it is possible to minimize the electronic equipment in which the heat radiating apparatus is employed.

The foregoing embodiments and advantages are merely exemplary and are not to be construed as limiting the invention. The present teaching can be readily applied to other types of apparatuses. The description of the invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A heat radiating apparatus, comprising:
   a heat sink configured to be positioned in thermal contact with a heat source in order to take heat from the heat source;
   at least one heat pipe having a portion connected to the heat sink and configured to transfer the heat from the heat sink;
   a heat exchanger in thermal communication with the at least one heat pipe, formed with a through chamber at a center thereof, and positioned adjacent to the heat sink wherein the at least one heat pipe vertically penetrates the heat exchanger between the through chamber and a perimeter of the heat exchanger; and
   a fan unit installed at least partially in the through chamber of the heat exchanger and configured to generate an airflow through the heat exchanger, the fan unit comprising a motor base, a motor, and a fan, wherein the motor base has a bearing support portion that is disposed between the heat exchanger and the heat sink.

2. The heat radiating apparatus as claimed in claim 1, further comprising:
   a fixing clip configured to be mounted to a heat source.

3. The heat radiating apparatus as claimed in claim 2, wherein the fixing clip comprises a plate, to a surface of which the heat sink is attached and at least one fixing leg provided at a rim of the plate, the fixing leg supporting the plate to be positioned a predetermined height from the heat source.

4. The heat radiating apparatus as claimed in claim 3, wherein the heat sink comprises a circular shaped disk.

5. The heat radiating apparatus as claimed in claim 4, wherein the at least one heat pipe comprises a plurality of heat pipes bent in a 'U' shape with both ends thereof in parallel with each other, and wherein an intermediate portion of the heat pipes is in thermal contact with the heat sink.

6. The heat radiating apparatus as claimed in claim 4, wherein one end of each of the at least one heat pipe is in thermal contact with the heat sink, and the other end thereof extends vertically from a surface of the heat sink.

7. The heat radiating apparatus as claimed in claim 2, wherein the heat sink comprises:
   a base block having a surface provided with a heat source contact portion which is exposed below the fixing clip and which comes into direct contact with the heat source, and another surface formed with at least one seating groove into which the at least one heat pipe is seated.

8. The heat radiating apparatus as claimed in claim 7, wherein the heat sink further comprises:
   a cover plate configured to be engaged onto the base block in order to fix the at least one heat pipe into the at least one seating groove.

9. The heat radiating apparatus of claim 8, wherein the cover plate is configured to be fastened to the motor base of the fan unit.

10. The heat radiating apparatus as claimed in claim 2, wherein the heat exchanger comprises at least one tool through hole configured to receive therethrough a tool for fastening and loosening screws for fixing the fixing clip, the at least one tool through hole formed at a position corresponding to a fixing leg of the fixing clip.

11. The heat radiating apparatus as claimed in claim 1, wherein the heat exchanger is formed in a circular cylindrical shape.

12. The heat radiating apparatus as claimed in claim 11, wherein the heat exchanger is formed by laminating a plurality of radiating fins at predetermined intervals, each of the radiating fins shaped in a circular disk with a vent hole at a center thereof.

13. The heat radiating apparatus as claimed in claim 1, wherein the heat exchanger comprises a plurality of radiating fins and the radiating fins extend in a lateral direction substantially parallel to one another and are supported only by the at least one heat pipe.

14. The heat radiating apparatus as claimed in claim 1, wherein the motor base is configured to be installed on the heat sink with guide bosses that penetrate guide holes of the heat sink and is formed of a material having a low heat transfer rate, the motor is directly supported on the motor base by bearing support portion and is configured to provide a driving force, and the fan is driven by the motor and is configured to radially discharge air introduced therein in a direction of its rotational axis.

15. The heat radiating apparatus as claimed in claim 1, wherein the at least one heat pipe penetrates the heat sink, and at least one end of each of the at least one heat pipe extends vertically from a rim of the heat sink.

16. The heat radiating apparatus as claimed in claim 1, wherein heat exchange occurs in the heat exchanger when air radially passes through the heat exchanger from the through chamber to outside the heat exchanger.

17. A heat radiating apparatus, comprising:
   a heat sink configured to be positioned in thermal contact with a heat source in order to take heat from the heat source;
   at least one heat pipe having a portion connected to the heat sink and configured to transfer the heat from the heat sink;
   a heat exchanger in the form of a cylinder in thermal communication with the at least one heat pipe and positioned adjacent to the heat sink, the heat exchanger having a central through hole wherein the at least one heat pipe vertically penetrates the heat exchanger between the central through hole and a perimeter of the heat exchanger; and
   a fan unit installed at least partially in the cylinder and configured to generate an airflow through the heat exchanger; and
   at least one tool through hole formed in the heat exchanger between the central through hole and the perimeter of the heat exchanger, the at least one tool through hole extending along a length thereof substantially parallel to a central longitudinal axis of the cylinder, wherein the at least one tool through hole is configured to receive therethrough a tool for fastening and loosening screws for fixing a fixing clip to the heat sink.

18. The heat radiating apparatus as claimed in claim 17, wherein the heat exchanger and the fan unit have substantially the same longitudinal dimension.

19. The heat radiating apparatus as claimed in claim 17, wherein the fixing clip comprises a plate, to a surface of which the heat sink is attached and at least one fixing leg provided at a rim of the plate, the fixing leg supporting the plate to be positioned a predetermined height from the heat source.

20. The heat radiating apparatus as claimed in claim 19, wherein one end of each of the at least one heat pipe is in thermal contact with the heat sink, and the other end thereof extends vertically from a surface of the heat sink.

21. The heat radiating apparatus as claimed in claim 19, wherein the at least one heat pipe comprises a plurality of heat pipes bent in a 'U' shape with both ends thereof in parallel with each other, and wherein an intermediate portion of the heat pipes is in thermal contact with the heat sink.

22. The heat radiating apparatus as claimed in claim 17, wherein the heat sink comprises:
a base block having a surface provided with a heat source contact portion which is exposed below the fixing clip and which comes into direct contact with the heat source, and another surface formed with at least one seating groove into which the at least one heat pipe is seated.

23. The heat radiating apparatus as claimed in claim 22, wherein the heat sink further comprises:
a cover plate configured to be engaged onto the base block in order to fix the at least one heat pipe into the at least one seating groove.

24. The heat radiating apparatus of claim 23, wherein the cover plate is configured to be fastened to the motor base of the fan unit.

25. The heat radiating apparatus as claimed in claim 17, wherein the heat exchanger is formed by laminating a plurality of radiating fins at predetermined intervals, each of the radiating fins shaped in a circular disk with a vent hole at a center thereof.

26. The heat radiating apparatus as claimed in claim 17, wherein the heat exchanger comprises a plurality of radiating fins and the radiating fins extend in a lateral direction substantially parallel to one another and are supported only by the at least one heat pipe.

27. The heat radiating apparatus as claimed in claim 17, wherein the at least one heat pipe penetrates the heat sink, and at least one end of each of the at least one heat pipe extends vertically from a rim of the heat sink.

28. The heat radiating apparatus of claim 17, wherein the heat exchanger is in the form of a substantially circular cylinder.

* * * * *